United States Patent
Hochstein

(10) Patent No.: US 8,256,113 B2
(45) Date of Patent: Sep. 4, 2012

(54) METHOD OF MANUFACTURING AN ELECTRICALLY DRIVEN LED LAMP ASSEMBLY

(75) Inventor: Peter A. Hochstein, Troy, MI (US)

(73) Assignee: Relume Technologies, Inc., Oxford, MI (US)

(*) Notice: Subject to any disclaimer, the term of this patent is extended or adjusted under 35 U.S.C. 154(b) by 659 days.

(21) Appl. No.: 12/467,535

(22) Filed: May 18, 2009

(65) Prior Publication Data

US 2009/0223047 A1    Sep. 10, 2009

Related U.S. Application Data

(62) Division of application No. 11/592,586, filed on Nov. 3, 2006.

(51) Int. Cl.
*H01R 43/00* (2006.01)
*H05K 13/00* (2006.01)

(52) U.S. Cl. .......... 29/854; 29/825; 29/829; 29/831; 29/846

(58) Field of Classification Search .......... 29/854, 29/825, 829, 831, 846; 257/59, 72, 88, 99, 257/676, 706, 707, 774
See application file for complete search history.

(56) References Cited

U.S. PATENT DOCUMENTS

| | | | |
|---|---|---|---|
| 5,243,218 A | 9/1993 | Zenitani et al. | |
| 5,857,767 A | 1/1999 | Hochstein | |
| 6,428,189 B1 | 8/2002 | Hochstein | |
| 6,498,355 B1 * | 12/2002 | Harrah et al. | 257/99 |
| 6,517,218 B2 | 2/2003 | Hochstein | |
| 6,735,865 B2 | 5/2004 | Leu et al. | |
| 6,920,046 B2 | 7/2005 | Spryshak | |
| 6,936,855 B1 * | 8/2005 | Harrah | 257/88 |

* cited by examiner

*Primary Examiner* — Thiem Phan
(74) *Attorney, Agent, or Firm* — Dickinson Wright PLLC

(57) ABSTRACT

A method of manufacturing an electrically driven L.E.D. lamp assembly (20) comprises disposing an electrically insulative coating (24) on a thermally conductive substrate (22). A plurality of light emitting diodes (26) is secured to the coating (24). A coupling agent is disposed on a tape portion (48) of a foil tape (46), and the foil tape (46) is secured to the coating (24) with the coupling agent in predetermined spaced lengths (42) along the coating (24) to establish discrete and electrically conductive spaced lengths (42) with the light emitting diodes (26) disposed between the spaced lengths (42). Each light emitting diode (26) includes a pair of electrical leads (32) which are secured to the spaced lengths (42) to electrically interconnect the light emitting diodes (26).

3 Claims, 1 Drawing Sheet ate substrate with an electrically insulating coating disposed on the substrate and having a low thermal resistance for transferring heat to the substrate. A plurality of light emitting diodes are secured to the coating with each of the light emitting diodes having a pair of LED electrical leads. An electrically conductive circuit is disposed on the coating and a lead interconnection and coupling agent is disposed about the LED electrical leads and the circuit for securing the LED electrical leads to the circuit to electrically interconnect the light emitting diodes. The circuit includes a foil tape having an electrically conductive tape portion and a coupling portion disposed on the tape portion to secure the foil tape to the coating whereby heat generated by the light emitting diodes is transferred from the light emitting diodes through the coating to the substrate for dissipating the heat.

In accordance with the subject invention, a method of manufacturing an electrically driven L.E.D. lamp assembly comprises the steps of disposing an electrically insulative coating having a low thermal resistance on a thermally conductive substrate, securing a plurality of light emitting diodes to the coating with each light emitting diode having a pair of LED electrical leads, disposing a coupling agent on a tape portion of a foil tape to establish an adhesive portion of the foil tape for securing the foil tape to the insulative coating, securing the foil tape to the coating with the coupling agent in predetermined spaced lengths along the coating to establish discrete and electrically conductive spaced lengths of the foil tape for preventing electrical conduction between the spaced lengths and from the spaced lengths to the light emitting diodes, and securing the LED electrical leads to the spaced lengths of the foil tape to electrically interconnect the light emitting diodes.

The subject invention permits the production of large LED arrays at relatively low cost in small to moderate volumes.

METHOD OF MANUFACTURING AN ELECTRICALLY DRIVEN LED LAMP ASSEMBLY

CROSS REFERENCE TO RELATED APPLICATION

This application is a divisional of application Ser. No. 11/592,586, for LED Light Engine With Applied Foil Construction, filed on Nov. 3, 2006.

BACKGROUND OF THE INVENTION

1. Field of the Invention

The subject invention relates to light emitting diodes mounted in an array on a circuit and, more particularly, to physically large tight emitting diode arrays.

2. Description of the Prior Art

Light emitting diodes (LEDs) have been available since the early 1960's in various forms, and are now widely applied in a variety of signs and message boards. The relatively high efficacy of LEDs (in lumens per Watt) is the primary reason for their popularity. Tremendous power savings are possible when LED lamps are used to replace traditional incandescent lamps of similar luminous output. With the increasing popularity and technology of LEDs, physically large LED arrays are becoming more common as LED performance improves and allows the devices to be used for large outdoor display and advertising panels. Such signs are commonly fabricated with large numbers of high power LEDs (0.5 Watt and higher) which require adequate heat sinking for reasonable life. These LED signs are commonly assembled with wired modules or more preferentially with integral 'plug and play' substrates which have all the LEDs interconnected and heat sinked onto a metal plate. U.S. Pat. No. 5,857,767 to Hochstein describes this technology, and it has been widely applied commercially for lighting channel letters, shelter lighting, and high performance beacons and searchlights for the military. As noted in the '767 patent, the conductors that interconnect the LEDs disposed on the insulated metal substrate, are typically screen printed with a conductive ink that is subsequently cured to form the circuit traces. LEDs are then adhesively secured to these printed conductors to complete the circuit.

While this process is very cost effective in larger volumes, the necessity of preparing printing screens is burdensome for small runs, particularly in larger sizes, which can approach several square meters. The circuit artwork is typically computer generated, but actual size, process negatives (or positives} must be created and then 'burned in' on a suitably photosensitized screen. That screen must then be developed, washed out and placed in a precision screen printing machine. Conductive, usually silver, based inks are then used to create the circuit (impression) on the insulated metal substrate. When only a few of these substrates are printed, the waste of silver ink is significant, and the process looses its attractiveness because of cost and complexity. It is impractical to use conventional printed circuit techniques for large LED panels because of the cost. Further, photoetched printed circuits employ environmentally unfriendly processes that become unmanageable with very large substrates.

SUMMARY OF THE INVENTION AND ADVANTAGES

In accordance with the subject invention, an electrically driven L.E.D. lamp assembly comprises a thermally conduc-

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate like or corresponding parts throughout the several views, an electronically driven L.E.D. lamp assembly is generally shown at 20. The L.E.D. lamp assembly 20 comprises art electrically and thermally conductive substrate 22. Preferably, the substrate 22 is made of metal, preferably aluminum which exhibits excellent thermal conduction at a moderate cost. Typically, aluminum 3000 or 5000 series alloy having a substrate thickness $T_1$ in the range of 1 to 2 millimeters provides adequate mechanical rigidity and thermal management.

An electrically insulative coating 24 is disposed on the substrate 22 for electrically isolating the substrate 22. The coating 24 preferably has a coating thickness $T_2$ in the range of 10 to 50 micrometers and a low thermal resistance for transferring heat to the substrate 22. There are any number of suitable insulative coatings 24 that can be applied to the substrate 22 to provide the necessary electrical isolation and acceptable thermal resistance. Coatings 24 found to be useful have included anodizing, thin film polyester or polyimide which were adhesively attached, and various high temperature, painted finishes.

Figure 2:
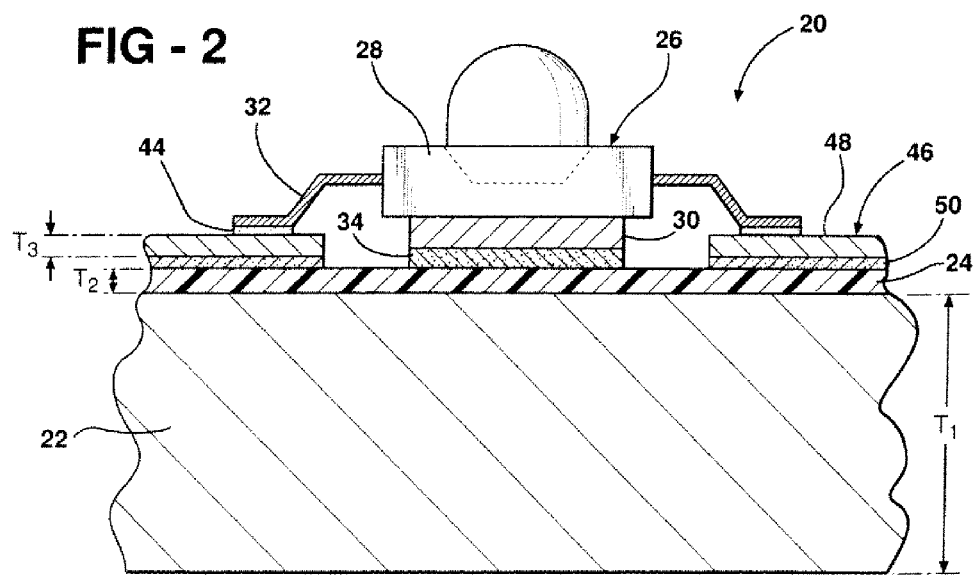
FIG. 2 is a cross-sectional fragmentary view of an electrically driven L.E.D. lamp assembly.

A plurality of light emitting diodes 26 generally indicated are disposed on the coating 24. Each of the light emitting diodes 26 has a LED body 28 and a LED heat sink 30 for dissipating heat generated by the LED body 28 and a pair of LED electrical leads 32. The LED body 28 is disposed on the LED heat sink 30 and the LED heat sink 30 is disposed on the coating 24 as shown in FIG. 2.

A component coupling agent 34 is disposed between the LED heat sink 30 of the light emitting diode 26 and the coating 24 for securing the light emitting diode 26 to the coating 24. The component coupling agent 34 is thermally conductive for transferring heat from the LED heat sink 30 to the coating 24. The component coupling agent 34 is generally a thermally conductive epoxy, a thin layer of cyanoacrylate adhesive, or any other thermally conductive coupling agent. It has been found that low viscosity cyanoacrylate adhesives permit a very thin bond line, typically micrometers, which enhances heat transfer to the substrate 22 substantially, while providing essentially instant part attachment. Thermally conductive fillers such as specialty elastomeric tapes may be used in lieu of adhesives, but these materials generally perform optimally only under continual pressure. A spring clip or other mounting means could be used to secure the light emitting diode 26 to the insulated substrate 22.

Figure 1:
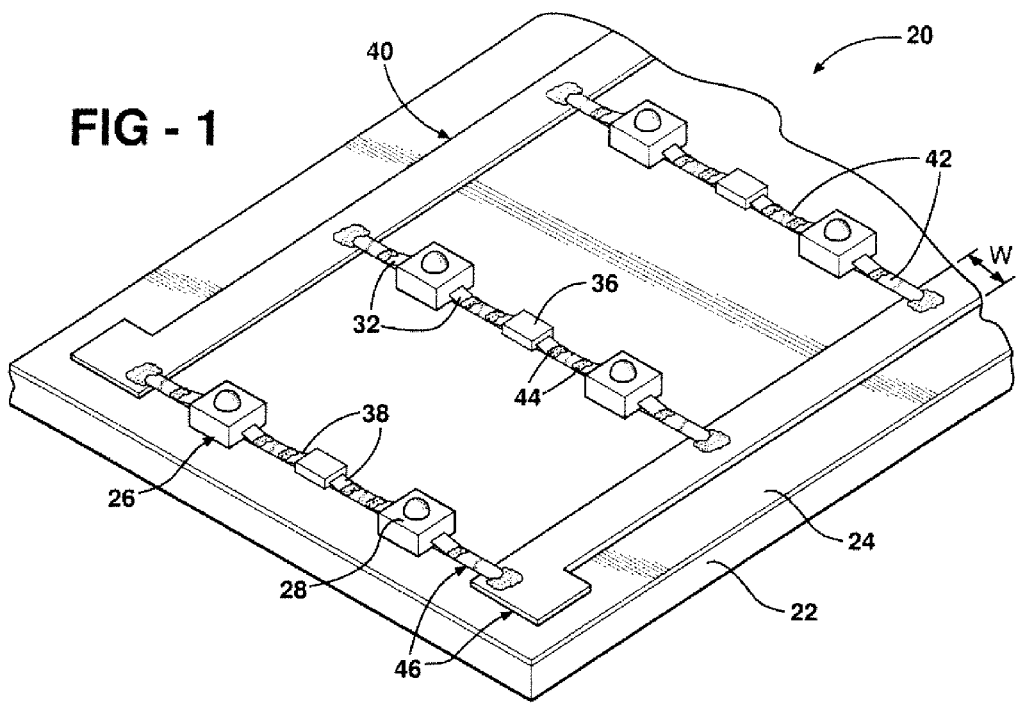
FIG. 1 is a perspective fragmentary view of the electrically driven L.E.D. lamp assembly.

In an embodiment of the invention as shown in FIG. 1, a plurality of ballast resistors 36 are disposed on the coating 24 with each of the ballast resistors 36 having a pair of resistor electrical leads 38. The component coupling agent 34 is disposed between each of the ballast resistors 36 and the coating 24 for securing the ballast resistors 36 to the coating 24. The thermally conductive component coupling agent 34 is generally a thermally conductive epoxy or a cyanoacrylate adhesive. The Wattage ratings of surface mount resistors employed in this fashion is virtually doubled in terms of temperature rise by securing the ballast resistors 36 to the coating 24 with the thermally conductive component coupling agent 34.

An electrically conductive circuit 40 generally indicated is disposed on the coating 24 in predetermined spaced lengths 42 along the coating 24 to establish discrete and electrically conductive spaced lengths 42 of the circuit 40 for preventing electrical conduction between the spaced lengths 42 and from the spaced lengths 42 to the LED heat sinks 30 and the ballast resistors 36. The circuit 40 is disposed on the coating 24 with provisions for openings for the light emitting diodes 26 and ballast resistors 36 as shown in FIG. 1.

An electrically conductive lead coupling agent 44 is disposed about the LED electrical leads 32 and the circuit 40 for securing the LED electrical leads 32 to the spaced lengths 42 of the circuit 40 and disposed about the resistor electrical leads 38 and the circuit 40 for securing the resistor electrical leads 38 to the spaced lengths 42 of the circuit 40 to electrically interconnect the light emitting diodes 26 and the ballast resistors 36. The thermally conductive component coupling agent 34 secures the LED heat sinks 30 and the ballast resistors 36 to the coating 24, holding the light emitting diodes 26 and the ballast resistors 36 in correct orientation for the LED electrical leads 32 and the resistor electrical leads 38 to contact the spaced lengths 42 of the circuit 40. The LED and resistor electrical leads 32, 38 may be soldered or otherwise secured to the circuit 40 with a conductive adhesive or welded to the circuit 40.

The circuit 40 generally indicated includes a foil tape 46 having a tape portion 48 and a coupling portion 50. The foil tape 46 has a foil width W capable of being varied to compensate for varying currents in the L.E.D. lamp assembly 20. Bus bars that feed a plurality of light emitting diodes 26 naturally carry higher currents and the width of the foil tape 46 is preferably wider to minimize voltage drops as shown in FIG. 1. The lead coupling agent 44 can be disposed about foil tapes 46 of various widths to electrically interconnect the foil tapes 46 as shown in FIG. 1.

The tape portion 48 of the foil tape 46 is electrically conductive and preferably is a metal such as thin aluminum or copper. Preferably, the tape portion 48 has a foil thickness $T_3$ in the range of 20 to 100 micrometers and is bright tin plated for resisting corrosion. Venture Tape of Rockland, Md. manufactures a tin plated copper tape having a thickness of 75 micrometers (Series 1690) that is particularly useful for the present invention. In a first embodiment of the invention, the coupling portion 50 is a pressure sensitive adhesive disposed axially along the tape portion 48 to adhere the foil tape 46 to the coating 24, however, various adhesives may also be used in additional embodiments to impart special properties to the finished product. In an alternative embodiment of the invention, the coupling portion 50 is a thermoset adhesive such as an epoxy for attaching the foil tape 46 to the coating 24 to achieve higher service temperatures.

During operation, heat generated by the LED body 28 is dissipated by the LED heat sink 30 and transferred from the LED heat sink 30 through the thermally conductive component coupling agent 34 and through the insulative coating 24 to the thermally conductive substrate 22 for dissipating the heat generated by the LED body 28.

Accordingly, the electrically driven L.E.D. lamp assembly 20 is manufactured by disposing an electrically insulative coating 24 having a coating thickness $T_2$ in the range of 20 to 100 micrometers and a low thermal resistance on a metal substrate 22 typically an aluminum 3000 or 5000 series alloy and a substrate thickness $T_1$ in the range of 1 to 2 millimeters to electrically isolate the substrate 22, adhesively securing a plurality of LED heat sinks 30 of a plurality of light emitting diodes 26 to the coating 24 by disposing a thermally conductive adhesive between the coating 24 and the LED heat sink 30 with each heat sink of each light emitting diode 26 having a LED body 28 disposed thereon and with each light emitting diode 26 having a pair of LED electrical leads 32, adhesively securing a plurality of ballast resistors 36 to the coating 24 with a thermally conductive adhesive with each ballast resistor 36 having a pair of resistor electrical leads 38, tinning a metal and electrically conductive tape portion 48 of a foil tape 46 having a variable foil width W with bright tin for resisting corrosion with the tape portion 48 having a foil thickness $T_3$ in the range of 20 to 100 micrometers, disposing a pressure sensitive adhesive axially along the tape portion 48 of the foil tape 46 to establish a coupling portion 50 for adhering the foil tape 46 to the coating 24, adhesively securing the foil tape 46 to the coating 24 with the coupling agent in predetermined spaced lengths 42 along the coating 24 to establish discrete and electrically conductive spaced lengths 42 of the foil tape 46 for preventing electrical conduction between the spaced lengths 42 and from the spaced lengths 42 to the LED heat sinks 30 and the ballast resistors 36, and adhesively securing the LED electrical leads 32 to the spaced lengths 42 of the foil tape 46 and the resistor electrical leads 38 to the spaced lengths 42 of the foil tape 46 with an electrically conductive adhesive or solder to electrically interconnect the light emitting diodes 26 and the ballast resistors 36.

In an alternative embodiment of the present invention, the electrically driven L.E.D. lamp assembly 20 includes the steps of cutting a sheet of metal foil to define a circuit 40 of the foil tape 46 and transferring the circuit 40 of foil tape 46 to the coating 24 by placing the circuit 40 on a transfer sheet for disposing the circuit 40 on the coating 24.

Obviously, many modifications and variations of the present invention are possible in light of the above teachings and may be practiced otherwise than as specifically described while within the scope of the appended claims. In addition, the reference numerals in the claims are merely for convenience and are not to be read in any way as limiting.

ELEMENT LIST

| Element Symbol | Element Name |
|---|---|
| 20 | lamp assembly |
| 22 | substrate |
| 24 | coating |
| 26 | light emitting diodes |
| 28 | LED body |
| 30 | LED heat sink |
| 32 | LED electrical leads |
| 34 | component coupling agent |
| 36 | ballast resistors |
| 38 | resistor electrical leads |
| 40 | circuit |
| 42 | spaced lengths |
| 44 | lead coupling agent |
| 46 | foil tape |
| 48 | tape portion |
| 50 | coupling portion |
| $T_1$ | substrate thickness |
| $T_2$ | coating thickness |
| $T_3$ | foil thickness |
| W | foil width |

What is claimed is:

1. A method of manufacturing an electrically driven L.E.D. lamp assembly (20) comprising the steps of;
    disposing an electrically insulative coating (24) having a low thermal resistance on an electrically conductive and thermally conductive substrate (22),
    securing a plurality of light emitting diodes (26) to the coating (24) with each light emitting diode (26) having a pair of LED electrical leads (32),
    disposing a coupling agent on a tape portion (48) of a foil tape (46) to establish a coupling portion (50) of the foil tape (46) for securing the foil tape (46) to the coating (24),
    securing the foil tape (46) to the coating (24) with the coupling agent in predetermined spaced lengths (42) along the coating (24) to establish discrete and electrically conductive spaced lengths (42) of the foil tape (46) for preventing electrical conduction between the spaced lengths (42) and from the spaced lengths (42) to the light emitting diodes (26),
    securing the LED electrical leads (32) to the spaced lengths (42) of the foil tape (46) to electrically interconnect the light emitting diodes (26),
    adhesively securing a plurality of ballast resistors (36) to the coating (24) with a thermally conductive adhesive with each ballast resistor (36) having a pair of resistor electrical leads (38), and wherein
    said disposing the electrically insulative coating (24) step is further defined as disposing the electrically insulative coating (24) having a coating thickness ($T_2$) in the range of 20 to 100 micrometers on the thermally conductive substrate (22) formed of aluminum and having a substrate thickness ($T_1$) in the range of 1 to 2 millimeters to electrically isolate the substrate (22),
    said securing the plurality of light emitting diodes (26) step is further defined as adhesively securing a plurality of LED heat sinks (30) of the plurality of light emitting diodes (26) to the coating (24) by disposing a thermally conductive adhesive between the coating (24) and the LED heat sink (30) with each heat sink (32) of each light emitting diode (26) having a LED body (28) disposed thereon,
    said disposing the coupling agent (34) on the tape portion (48) to establish the coupling portion (50) step is further defined as plating the tape portion (48) formed of an electrically conductive metal having a variable foil width (W) and a foil thickness ($T_3$) in the range of 20 to 100 micrometers and disposing a pressure sensitive adhesive axially along the tape portion (48) of the foil tape (46) to establish the coupling portion (50) for adhering the foil tape (46) to the coating (24),
    said securing the foil tape (46) to the coating (24) step is further defined as adhesively securing the foil tape (46) to the coating (24) with the coupling agent (34) for preventing electrical conduction between the spaced lengths (42) and from the spaced lengths (42) to the LED heat sinks (30) and the ballast resistors (36), and
    said securing the LED electrical leads (32) to the spaced lengths (42) step is further defined as adhesively securing the LED electrical leads (32) to the spaced lengths (42) of the foil tape (46) and the resistor electrical leads (38) to the spaced lengths (42) of the foil tape (46) with an electrically conductive adhesive to electrically interconnect the light emitting diodes (26) and the ballast resistors (36).

2. A method as set forth in claim 1 wherein said adhesively securing the LED electrical leads (32) to the spaced lengths (42) of the foil tape (46) and the resistor electrical leads (38) to the spaced lengths (42) of the foil tape (46) step is further defined as soldering the LED electrical leads (32) to the spaced lengths (42) of the foil tape (46) and the resistor electrical leads (38) to the spaced lengths (42) of the foil tape (46) to electrically interconnect the light emitting diodes (26) and the ballast resistors (36).

3. A method as set forth in claim 1 including the steps of;
    cutting a sheet of metal foil to define a circuit (40) of the foil tape (46), and
    transferring the circuit (40) of foil tape (46) to the coating (24) by placing the circuit (40) on a transfer sheet for disposing the circuit (40) on the coating (24).

* * * * *